United States Patent [19]
Kawamura

[11] Patent Number: 5,278,082
[45] Date of Patent: Jan. 11, 1994

[54] METHOD FOR ELECTRICALLY CONNECTING AN ELECTRODE AND IMPURITY-DIFFUSED LAYER FORMED ON A SEMICONDUCTOR SUBSTRATE

[75] Inventor: Akio Kawamura, Nara, Japan

[73] Assignee: Sharp Kabushiki Kaisha, Osaka, Japan

[21] Appl. No.: 36,621

[22] Filed: Mar. 24, 1993

[30] Foreign Application Priority Data

Apr. 3, 1992 [JP] Japan .................. 4-081969

[51] Int. Cl.$^5$ .......................... H01L 21/265
[52] U.S. Cl. ........................ 437/29; 437/52; 257/377; 257/382; 257/903
[58] Field of Search ............ 437/29, 52; 257/377, 257/382, 903, 904

[56] References Cited

U.S. PATENT DOCUMENTS

| | | | |
|---|---|---|---|
| 4,374,700 | 2/1983 | Scott et al. | 257/377 |
| 4,560,582 | 12/1985 | Ichikawa | 437/29 |
| 4,794,563 | 12/1988 | Maeda | 432/52 |
| 4,985,746 | 1/1991 | Asahina | 257/377 |
| 5,173,450 | 12/1992 | Wei | 437/52 |
| 5,204,279 | 4/1993 | Chan et al. | 437/52 |
| 5,210,042 | 5/1993 | Oshikawa | 437/29 |
| 5,219,779 | 6/1993 | Suzuki | 437/52 |

FOREIGN PATENT DOCUMENTS

| | | | |
|---|---|---|---|
| 0004053 | 1/1984 | Japan | 437/29 |
| 2007151 | 1/1987 | Japan | 257/904 |
| 0318150 | 12/1988 | Japan | 437/52 |
| 3-19343 | 1/1991 | Japan . | |
| 3-175676 | 7/1991 | Japan | 257/382 |

Primary Examiner—Olik Chaudhuri
Assistant Examiner—Long Pham
Attorney, Agent, or Firm—Nixon & Vanderhye

[57] ABSTRACT

A method for producing a semiconductor device in which an electrode and an impurity-diffused layer formed on a semiconductor substrate are electrically connected to each other, includes the following steps: forming a first insulating film on the semiconductor substrate; forming a first mask layer on the first insulating film, and forming a second mask layer on the first mask layer, the first mask layer comprising a first opening for exposing a part of the surface of the semiconductor substrate, the second mask layer comprising a second opening, at least the exposed part of the surface of the semiconductor substrate being exposed by the second opening; removing at least a part of the first insulating film exposed through the first opening; implanting a first impurity into the semiconductor substrate using the second mask layer as a mask and employing an acceleration energy at which the first impurity can pass through the first mask layer; removing the second mask layer, and forming the electrode doped with a second impurity so as to entirely cover the first opening; implanting a third impurity into the semiconductor substrate using the electrode as a mask; and activating the first impurity and the third impurity by annealing the semiconductor substrate, and diffusing the second impurity from the electrode to the semiconductor substrate by annealing the semiconductor substrate by annealing the semiconductor substrate, thereby forming the impurity-diffused layer.

6 Claims, 4 Drawing Sheets

METHOD FOR ELECTRICALLY CONNECTING AN ELECTRODE AND IMPURITY-DIFFUSED LAYER FORMED ON A SEMICONDUCTOR SUBSTRATE

BACKGROUND OF THE INVENTION

1. Field of the Invention

The present invention relates to a method for producing a semiconductor device, and more particularly, to a method for directly connecting an electrode and an impurity-diffused layer formed on a semiconductor substrate.

2. Description of the Related Art

A memory cell circuit to be used for a Static Random Access Memory (SRAM), one of the memory devices is formed from a plurality of Metal Oxide Semiconductor (MOS) transistors. A gate electrode of one of the MOS transistors is electrically connected to an impurity-diffused layer of another MOS transistor adjacent thereto. FIG. 5 is a plan view showing part of an exemplary memory cell circuit with such a configuration. As shown in FIG. 5, a transistor has a gate electrode 300, and a transistor adjacent thereto has an impurity-diffused layer 100. The surface of the impurity-diffused layer 100 is covered with an insulating film, and thus the impurity-diffused layer 100 is directly connected to the gate electrode 300 through an opening 200.

A conventional method for producing a semiconductor device in which the gate electrode 300 is electrically connected to the impurity-diffused layer 100 will be described below referring to FIGS. 3A through 3C.

First, as shown in FIG. 3A, an oxide film for isolation 103 is formed in the surface region of a semiconductor substrate 101, and a gate insulating film 102 is formed on the surface of the semiconductor substrate 101. Next, the gate insulating film 102 is partially etched, and an opening 200 is formed in the gate insulating film 102. A polysilicon film 107 doped with phosphorus is formed so as to cover the surface of the semiconductor substrate 101. The polysilicon film 107 may be replaced with a composite film made of a polysilicon film and a metal silicide film. Then, a resist 108 is formed on the polysilicon film 107 using lithography technique so as to define a gate electrode pattern. A region D is defined between an end portion 108a of the resist 108 and an end portion 102a of the gate insulating film 102 in the semiconductor substrate 101. That is to say, neither the resist 108 nor the gate insulating film 102 are formed above the region D.

Next, as shown in FIG. 3B, the polysilicon film 107 is partially etched using the resist 108 as a mask so as to form a gate electrode 300. At the same time, the region D of the semiconductor substrate 101 is also etched, and a groove 120 is formed in the semiconductor substrate 101. Subsequently, as shown in FIG. 3C, the resist 108 is removed, and then side-walls 121 and 122 made of silicon dioxide are formed on sides of the groove 120. The sidewall 121 is formed also on a side 300a of the gate electrode 300. Arsenic ions are implanted into the semiconductor substrate 101 through the gate insulating film 102 using the gate electrode 300 and the sidewalls 121 and 122 as masks. Thereafter, the semiconductor substrate 101 is annealed. The phosphorus is diffused from the gate electrode 300 to the semiconductor substrate 101, thereby forming an impurity-rich layer 111. The implanted arsenic is activated, thereby forming an impurity-rich layer 112. The impurity-rich layers 111 and 112 are formed so as to be electrically connected to each other, thereby constituting an impurity-diffused layer 100.

However, according to the conventional method, neither the resist 108 nor the gate insulating film 102 are formed above the region D as shown in FIG. 3A. Therefore, when the gate electrode 300 is formed, the region D of the semiconductor substrate 101 is etched, and the groove 120 is formed in the semiconductor substrate 101. When the sidewall 121 is formed on the side 300a of the gate electrode 300 and on the side of the groove 120, the sidewall 122 is also formed on the side of the groove 120. As a result, when the arsenic ions are implanted into the semiconductor substrate 101, the arsenic ions cannot be implanted into a portion of the semiconductor substrate 101 underlying the groove 120 due to the use of the side-walls 121 and 122 as the masks. As a result, at the region D of the semiconductor substrate 101 underlying the groove 120, the impurity-rich layers 111 and 112 cannot be electrically connected to each other. Thus, there is a possibility that the gate electrode 300 and the impurity-rich layer 112 will not be electrically conducted to each other.

Another conventional method for producing a semiconductor device in which the region D is not formed will be described below referring to FIGS. 4A through 4C.

First, as shown in FIG. 4A, an oxide film for isolation 103 is formed in the surface region of a semiconductor substrate 101, and a gate insulating film 102 is formed on the surface of the semiconductor substrate 101. Next, the gate insulating film 102 is partially etched, and an opening 200 is formed in the gate insulating film 102. A polysilicon film 107 doped with phosphorus is formed so as to cover the surface of the semiconductor substrate 101. The polysilicon film 107 may be replaced with a composite film made of a polysilicon film and a metal silicide film. Then, a resist 108 is formed on the polysilicon film 107 using lithography technique so as to define a gate electrode pattern. Both of the resist 108 and the gate insulating film 102 are formed above a region E of the semiconductor substrate 101.

Next, as shown in FIG. 4B, the polysilicon film 107 is partially etched using the resist 108 as a mask so as to form a gate electrode 300. Subsequently, as shown in FIG. 4C, the resist 108 is removed, and then a sidewall 121 made of silicon dioxide is formed on a side 300a of the gate electrode 300. Arsenic ions are implanted into the semiconductor substrate 101 through the gate insulating film 102 using the gate electrode 300 and the sidewall 121 as masks. Thereafter, the semiconductor substrate 101 is annealed. The phosphorus is diffused from the gate electrode 300 to the semiconductor substrate 101, thereby forming an impurity-rich layer 111. The implanted arsenic is activated, thereby forming an impurity-rich layer 112 The impurity-rich layers 111 and 112 are formed so as to be electrically connected to each other, thereby constituting an impurity-diffused layer 100.

According to the above method, considering the registration error, the gate electrode 300 is partially superimposed on the gate insulating film 102 above the region E. Therefore, the semiconductor substrate 101 would not be etched, so that a groove such as the groove 120 described above is not formed when the gate electrode 300 is formed.

However, when the arsenic ions are implanted into the semiconductor substrate 101 through the gate insulating film 102, the arsenic ions cannot be implanted into the region E of the semiconductor substrate 101 due to the use of the gate electrode 300 and the sidewall 121 as the masks. Moreover, in the case where the semiconductor substrate 101 is annealed, the doped phosphorus cannot be diffused to the region E of the semiconductor substrate 101 due to the presence of the gate insulating film 102. Therefore, the region E does not include impurities. As a result, at the region E of the semiconductor substrate 101, the impurity-rich layers 111 and 112 cannot be electrically connected to each other. Thus, there is a possibility that the gate electrode 300 and the impurity-rich layer 112 will not be electrically conducted to each other.

In order to overcome the above problem, it is possible to employ annealing conditions under which the phosphorus and arsenic ions may be easily diffused in the semiconductor substrate 101. When the annealing conditions are employed, the phosphorus and arsenic ions can be further diffused in the semiconductor substrate 101. Thus, the areas of the impurity-rich layers 111 and 112 can be enlarged enough to ensure the electrical conduction between the impurity-rich layers 111 and 112 at the region D (FIG. 3A) or the region E (FIG. 4A). However, this leads to an enlarged impurity-diffused layer including a source region and a drain region. Thus, the use of such annealing conditions would have a disadvantage in that devices constituting a memory circuit become large.

SUMMARY OF THE INVENTION

The method for producing a semiconductor device in which an electrode and an impurity-diffused layer formed on a semiconductor substrate are electrically connected to each other, comprises the following steps of: forming a first insulating film on the semiconductor substrate; forming a first mask layer on the first insulating film, and forming a second mask layer on the first mask layer, the first mask layer comprising a first opening for exposing a part of the surface of the semiconductor substrate, the second mask layer comprising a second opening, at least the exposed part of the surface of the semiconductor substrate being exposed by the second opening; removing at least a part of the first insulating film exposed through the first opening; implanting a first impurity into the semiconductor substrate using the second mask layer as a mask and employing an acceleration energy at which the first impurity can pass through the first mask layer; removing the second mask layer, and forming the electrode doped with a second impurity so as to entirely cover the first opening; implanting a third impurity into the semiconductor substrate using the electrode as a mask; and activating the first impurity and the third impurity by annealing the semiconductor substrate, and diffusing the second impurity from the electrode to the semiconductor substrate by annealing the semiconductor substrate by annealing the semiconductor substrate, thereby forming the impurity-diffused layer.

Thus, the invention described herein makes possible the advantage of providing a method for producing a semiconductor device in which the electrical connection between an electrode and an impurity-diffused layer is ensured and an enlargement of the impurity-diffused layer is prevented, thereby realizing fine devices.

This and other advantages of the present invention will become apparent to those skilled in the art upon reading and understanding the following detailed description with reference to the accompanying figures.

DESCRIPTION OF THE PREFERRED EMBODIMENTS

FIGS. 1A through 1H are cross-sectional views illustrating steps of producing a semiconductor device according to the present invention. FIG. 2 is a plan view illustrating a method of producing the semiconductor device. Hereinafter, the present invention will be described by exemplifying a method for producing a part of an SRAM circuit in which a gate electrode is directly connected to an impurity-diffused layer.

Figure 1A:
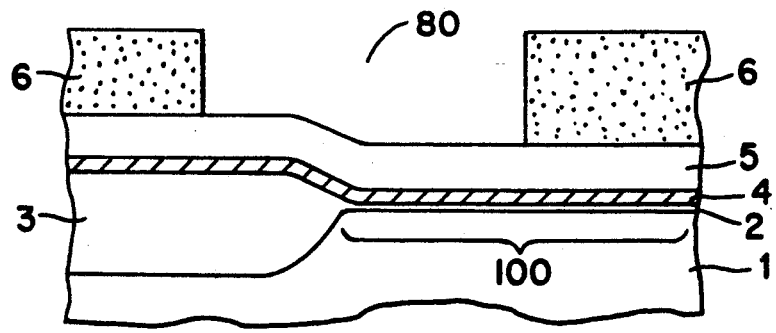
FIGS. 1A through 1H are cross-sectional views illustrating steps of producing a semiconductor device according to the present invention.
Figure 2:
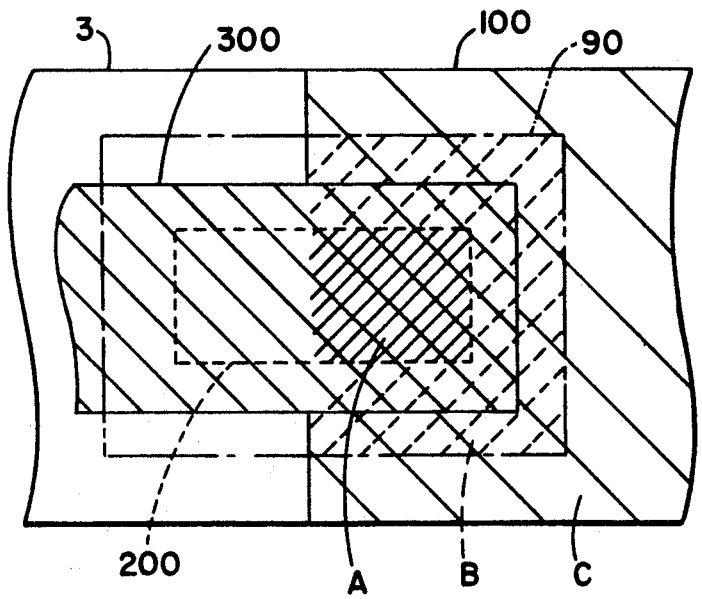
FIG. 2 is a plan view illustrating a method of producing the semiconductor device according to the present invention.
Figure 3A:
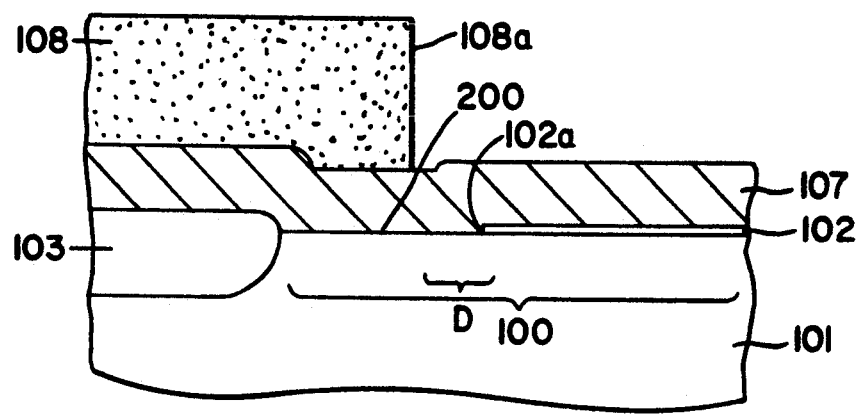
FIGS. 3A through 3C are cross-sectional views illustrating steps of producing a semiconductor device according to a conventional method.
Figure 3B:
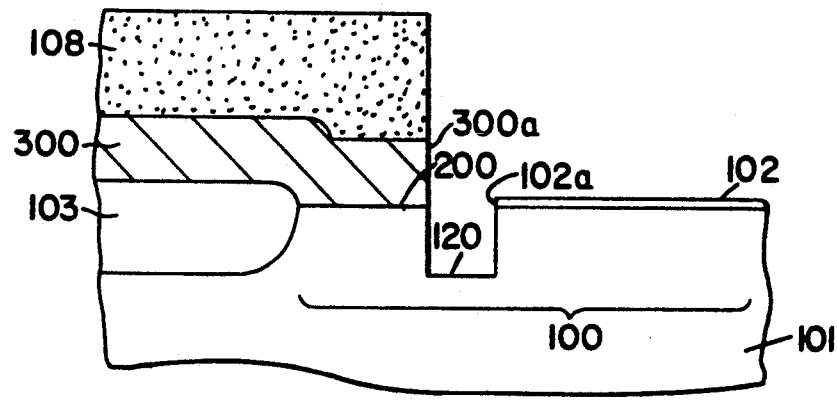
Figure 3C:
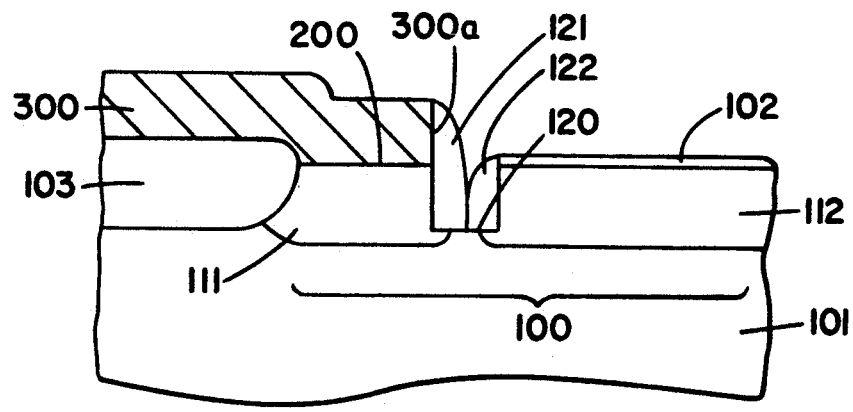
Figure 4A:
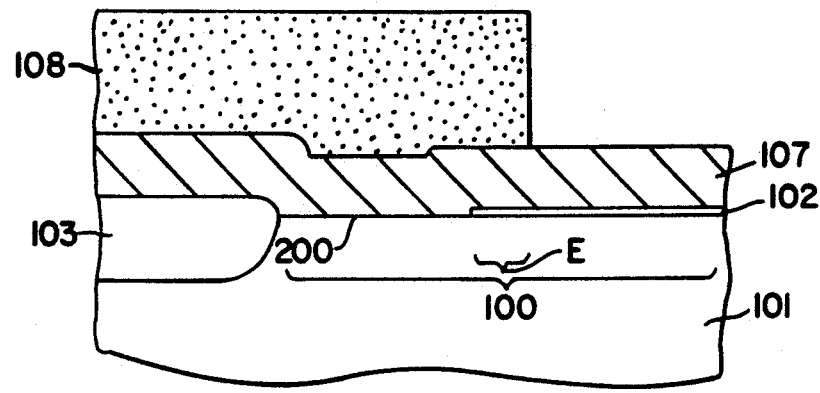
FIGS. 4A through 4C are cross-sectional views illustrating steps of producing a semiconductor device according to another conventional method.
Figure 4B:
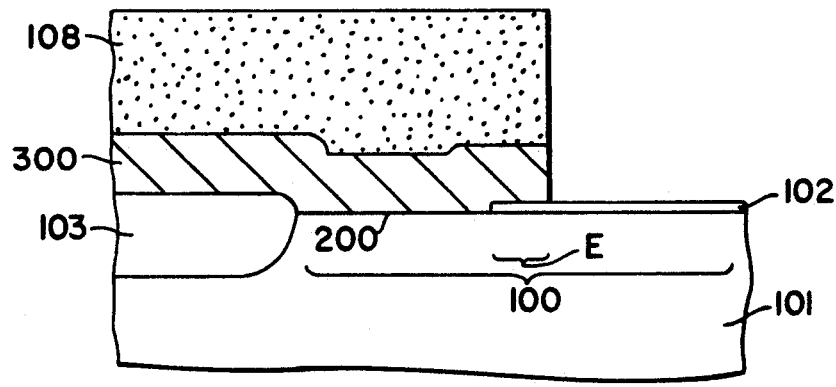
Figure 4C:
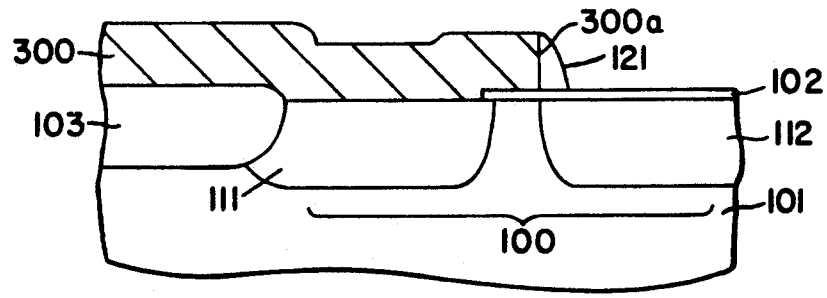
Figure 5:
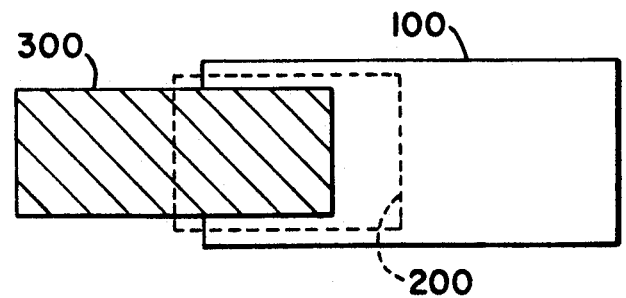
FIG. 5 is a plan view illustrating a method of producing the semiconductor device according to the conventional method.

As shown in FIG. 1A, the surface of a silicon substrate 1 is partially oxidized under the presence of wet oxygen, and an oxide film 3 (thickness: 400 nm) for isolation is formed in the surface region of the silicon substrate 1. Subsequently, the remaining part of the surface of the silicon substrate 1 is oxidized, and a gate insulating film 2 (thickness: 10 nm) is formed in the surface region of the silicon substrate 1. The oxide film 3 and the gate insulating film 2 constitute a first insulating film. On the oxide film 3 and the gate insulating film 2, a first mask film 4 (thickness: 20 nm) made of polysilicon is formed using a chemical vapor deposition (CVD) method. Furthermore, a second mask film 5 (thickness: 150 nm) made of silicon oxide is formed on the first mask film 4 using the CVD method. A resist pattern 6 having an opening 80 is formed on the second mask film 5 using lithography technique. The opening 80 is formed so as to be partially located above an impurity-diffused layer 100 to be formed in the later step.

Figure 1B:
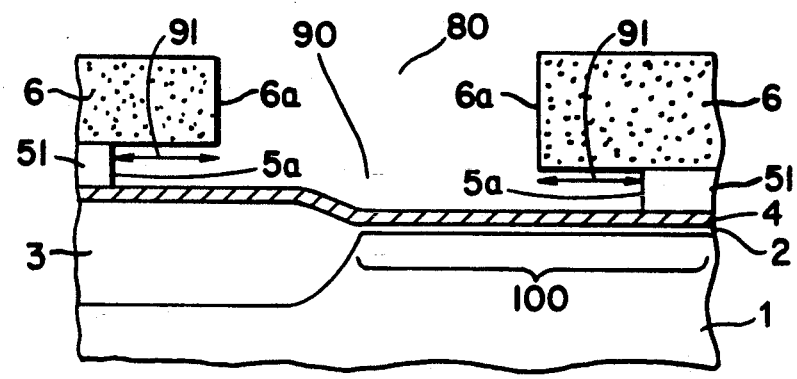

Next, as shown in FIG. 1B, the second mask film 5 is partially etched using the resist pattern 6 as a mask. Due to the etching process, a second mask layer 51 having a second opening 90 is formed. A portion of the second mask film 5 underlying the resist pattern 6 can be etched by using an isotropic etching method and an overetching method. The distance 91 between an end face 6a of the resist pattern 6 and an end face 5a of the second mask layer 51 is set to be in the range of 200 to 400 nm.

The materials of the first and second mask films 4 and 5 are not limited to the polysilicon and silicon dioxide, but any other materials may be used as long as the second mask film 5 can be etched at an appropriate rate without etching the first mask film 4 substantially. Similarly, though the present example employs a wet etching method in which an aqueous solution containing hydrofluoric acid is used, any other method may be employed to carry out the present invention as long as the second mask film 5 can be etched at the appropriate rate without etching the first mask film 4 substantially. For example, a silicon nitride film can be used as the first mask film 4, and a buffer hydrofluoric acid solution (BHF) can be used as an etchant. In the case where a silicon nitride film is used as the first mask film 4, the first mask film 4 functions as a gate insulating film.

Figure 1C:
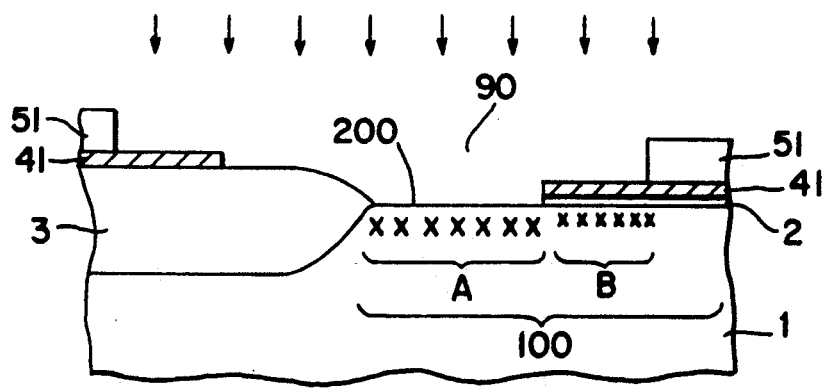

Furthermore, as shown in FIG. 1C, the portion of the first mask film 4 which is exposed by the second opening 90, and the gate insulating film 2 are partially etched using the resist pattern 6 as a mask. By using an anisotropic etching method, a first mask layer 41 having a first opening 200 is formed. The first opening 200 has the same shape as that of the opening 80. By the first opening 200, a part of the surface of the silicon substrate 1 is exposed. Due to the use of the resist pattern 6 as the mask, the second opening 90 and the first opening 200 can be formed so as to be self-aligned and located at precise positions. Accordingly, the part of the surface of the silicon substrate 1 exposed by the first opening 200 is also exposed by the second opening 90.

Next, after the resist pattern 6 is removed, a first impurity is implanted into the silicon substrate 1 by using the second mask layer 51 as a mask. The dose is $1 \times 10^{15}$ cm$^{-2}$ to $3 \times 10^{15}$ cm$^{-2}$. As the first impurity, phosphorus ions or arsenic ions may be used. The first impurity is accelerated so as to reach the silicon substrate 1 through the first mask layer 41. In the case where the phosphorus ions are used as the first impurity, the acceleration energy thereof is preferably 50 keV. On the other hand, in the case where the arsenic ions are used as the first impurity, the acceleration energy thereof is preferably 100 keV. Thus accelerated first impurity is directly implanted into an area A of the silicon substrate 1, and indirectly implanted into an area B through the gate insulating film 2 and the first mask layer 41. In FIGS. 1A through 1G, the implanted impurity ions are denoted as "X".

Figure 1D:
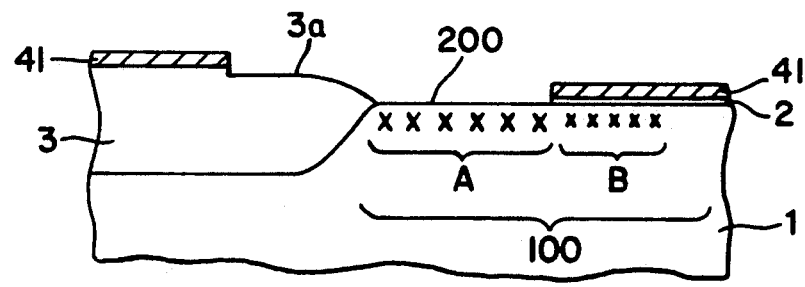

Next, as shown in FIG. 1D, the second mask layer 51 is removed using a dilute hydrofluoric acid solution. At this time, a part 3a of the surface of the oxide film 3 is also etched. The rate at which the oxide film 3 is etched by the dilute hydrofluoric acid solution is one fifth to one tenth of the rate at which the second mask layer 51 is etched by the dilute hydrofluoric acid solution. Therefore, the thickness of the oxide film 3 is slightly reduced by 15 to 30 nm.

Figure 1E:
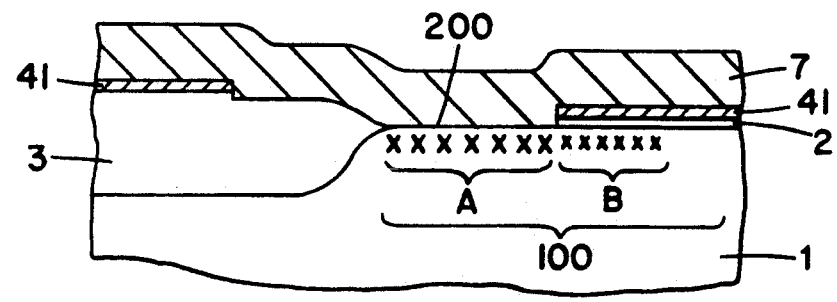

Next, as shown in FIG. 1E, a conductive film 7 (thickness: 150 nm) made of polysilicon is formed on the first mask layer 41, and on the oxide film 3 and the region A which are exposed by the first opening 200. The conductive film 7 includes phosphorus as a second impurity in high concentration. Moreover, in order to reduce wiring resistance, a second conductive film (thickness: 100 nm) made of tungsten silicide (not shown) is formed on the conductive film 7.

Figure 1F:
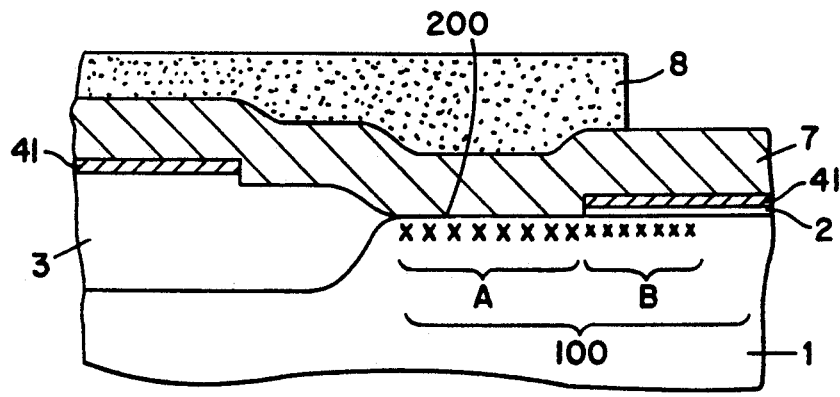
Figure 1G:
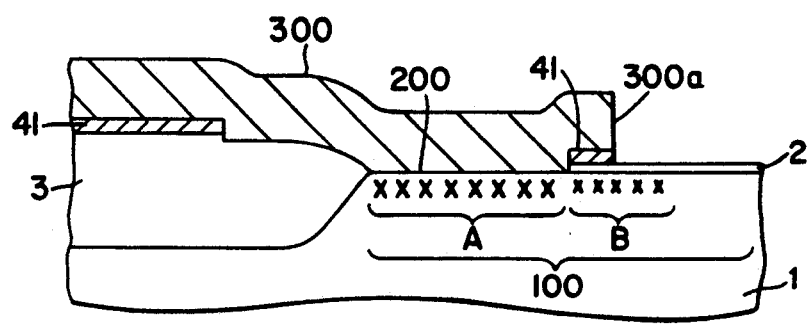

Next, as shown in FIG. 1F, a resist pattern 8 which defines the gate electrode pattern is formed on the conductive film 7 using lithography technique. As shown in FIG. 1G, the conductive film 7 and the first mask layer 41 are partially etched using the resist pattern 8, and a gate electrode 300 is formed. The gate electrode 300 is formed so as to entirely cover the first opening 200. Furthermore, a side 300a of the gate electrode 300 is located above the gate insulating film 2 which is formed on the region B implanted with the first impurity. In the case where a silicon nitride film is used as the first mask film 4, it is not necessary to remove the first mask layer 41 when the gate electrode 300 is formed. Therefore, only a part of the conductive film 7 is removed using the resist pattern 8 as a mask.

Figure 1H:
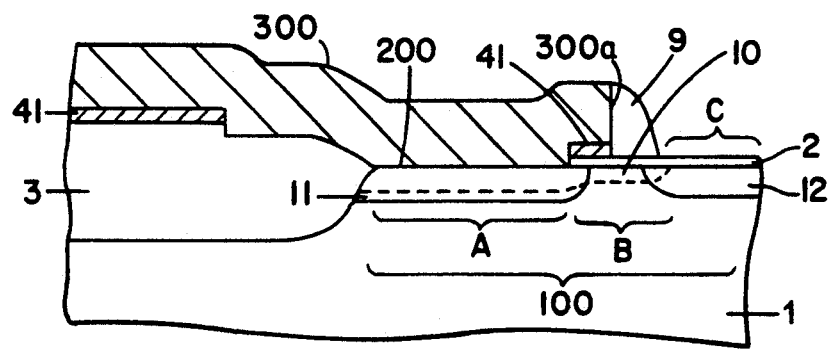

Next, phosphorus ions are implanted into the silicon substrate 1 through the gate insulating film 2 using the gate electrode 300 as a mask, thereby realizing a lightly doped drain (LDD) structure. The dose is $1 \times 10^{13}$ to $5 \times 10^{13}$ cm$^{-2}$ and the acceleration energy is 40 keV. Thereafter, as shown in FIG. 1H, a sidewall 9 made of silicon dioxide is formed on the side face 300a of the gate electrode 300. Then, a third impurity is implanted into a region C of the silicon substrate 1 using the gate electrode 300 and the sidewall 9 as masks. As the third impurity, arsenic ions are used. The dose is $1 \times 10^{15}$ to $3 \times 10^{15}$ cm$^{-2}$ and the acceleration energy is 50 keV.

Thereafter, the silicon substrate is annealed at a temperature of 900° C. The first impurity of phosphorus ions and the third impurity of arsenic ions are activated, and impurity-rich layers 10 and 12 are formed in the silicon substrate 1. The phosphorus is diffused from the gate electrode 300 to the silicon substrate 1, and an impurity-rich layer 11 is formed in the silicon substrate 1. These three impurity-rich layers 10, 11, and 12 are successively connected to each other, thereby forming an impurity-diffused layer 100.

As shown in FIGS. 1H and 2, the impurity-rich layer 11 is formed at the region A which is in contact with the gate electrode 300, and the impurity-rich layer 12 is formed at the region C which is not in contact with the gate electrode 300. These impurity-rich layers 11 and 12 can be electrically connected to each other via the impurity-rich layer 10. The impurity-rich layer 10 has been formed by implantation of the first impurity prior to the formation of the gate electrode 300. Such a configuration ensures the electrical conduction between the gate electrode 300 and the impurity-rich layer 12 of the impurity-diffused layer 100.

As is apparent from the above, according to the present invention, the gate insulating film 2 superimposed on the impurity-diffused layer 100 is etched so as to form the first opening 200, and the gate electrode 300 is formed so as to entirely cover the first opening 200. According to such a method, the surface of the silicon substrate 1 is not exposed, thereby not being etched when the gate electrode 300 is formed. Therefore, a groove is not formed in the silicon substrate 1, nor is a sidewall formed on a side of the groove. Thus, the gate electrode 300 and the impurity-diffused layer 100 can be prevented from being disconnected with each other due to the absence of the sidewall on the side of the groove.

Moreover, the first impurity is implanted into the region B of the impurity-diffused layer 100 on which the gate insulating film 2 has been formed before the gate electrode 300 is formed. Thus, the gate electrode 300 and the impurity-diffused layer 100 are perfectly electrically connected with each other. In addition, using the resist pattern 6 having the opening 80, the first opening 200 and the second opening 90 are formed with self alignment. Accordingly, an additional lithography step is not required, and the first impurity is implanted, using the second mask layer 51 having the second opening 90 as a mask, into the portion of the silicon substrate 1 including the portion of the silicon substrate 1 exposed by the first opening 200.

Moreover, the distance in which the impurity can be diffused is not changed since the annealing conditions are not required to be varied. Accordingly, the impurity-diffused layer 100 is not enlarged, thereby realizing fine devices.

Herein, the present invention has been described referring to the semiconductor device in which the gate electrode and the impurity-diffused layer of an n-type transistor in an SRAM are electrically connected to each other. However, the present invention can also be applied to a semiconductor device in which an electrode and a conduction region formed in a semiconductor substrate are electrically connected to each other. Moreover, the materials used for impurities, conductive films and insulating films would not be limited to those described herein, but any other materials can be used depending on a desired semiconductor device to be produced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor device in which an electrode and an impurity-diffused layer formed on a semiconductor substrate are electrically connected to each other, comprising the steps of:
    (a) forming a first insulating film on the semiconductor substrate;
    (b) forming a first mask layer on the first insulating film, and forming a second mask layer on the first mask layer, the first mask layer comprising a first opening for exposing a part of the surface of the semiconductor substrate, the second mask layer comprising a second opening, at least the exposed part of the surface of the semiconductor substrate being exposed by the second opening;
    (c) removing at least a part of the first insulating film exposed through the first opening;
    (d) implanting a first impurity into the semiconductor substrate using the second mask layer as a mask and employing an acceleration energy at which the first impurity can pass through the first mask layer;
    (e) removing the second mask layer, and forming the electrode doped with a second impurity so as to entirely cover the first opening;
    (f) implanting a third impurity into the semiconductor substrate using the electrode as a mask; and
    (g) activating the first impurity and the third impurity by annealing the semiconductor substrate, and diffusing the second impurity from the electrode to the semiconductor substrate by annealing the semiconductor substrate by annealing the semiconductor substrate, thereby forming the impurity-diffused layer.

2. A method for producing a semiconductor device according to claim 1, wherein an end portion of the electrode is located above the region of the semiconductor substrate where the first impurity is implanted.

3. A method for producing a semiconductor device according to claim 1, wherein the first insulating film comprises an oxide film for isolation and a gate insulating film.

4. A method for producing a semiconductor device according to claim 1, wherein the step (b) comprises the stages of:
    forming a first mask film on the first insulating film;
    forming a second mask film on the first mask film;
    forming a resist pattern on the second mask film;
    forming the second opening by partially removing the second mask film by an isotropic etching method using the resist pattern as a mask, thereby forming the second mask layer; and
    forming the first opening by partially removing a portion of the first mask film exposed by the second opening by the anisotropic etching method using the resist pattern as a mask, thereby forming the first mask layer.

5. A method for producing a semiconductor device according to claim 4, wherein the first mask film is made of polysilicon, and the step (e) comprises the stages of:
    removing the second mask layer, and forming a conductive film made of polysilicon so as to cover the surface of the semiconductor substrate;
    forming a second resist pattern so as to define an electrode pattern on the conductive film;
    partially etching the conductive film using the second resist pattern as a mask, thereby forming the electrode;
    partially etching the first mask layer using the second resister pattern as a mask; and
    forming a sidewall on a side face of the electrode.

6. A method for producing a semiconductor device according to claim 3, wherein the electrode is a gate electrode for a transistor to be used in a static RAM.

* * * * *